(12) United States Patent
Oh

(10) Patent No.: US 10,297,674 B2
(45) Date of Patent: May 21, 2019

(54) METHOD FOR MANUFACTURING A TRANSISTOR AND METHOD FOR MANUFACTURING A RING OSCILLATOR USING THE SAME

(71) Applicant: SK hynix Inc., Gyeonggi-do (KR)

(72) Inventor: Dong Yean Oh, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/824,373

(22) Filed: Nov. 28, 2017

(65) Prior Publication Data

US 2018/0240888 A1 Aug. 23, 2018

(30) Foreign Application Priority Data

Feb. 20, 2017 (KR) ........................ 10-2017-0022388

(51) Int. Cl.
*H01L 29/66* (2006.01)
*H01L 29/49* (2006.01)
*H01L 27/092* (2006.01)

(52) U.S. Cl.
CPC ...... *H01L 29/6653* (2013.01); *H01L 29/4991* (2013.01); *H01L 29/6656* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 6,169,017 B1 * | 1/2001 | Lee | H01L 21/28052 257/522 |
| 2011/0163367 A1 * | 7/2011 | Kang | H01L 21/764 257/316 |
| 2012/0199886 A1 | 8/2012 | Horak et al. | |
| 2013/0221414 A1 | 8/2013 | Zhao et al. | |

* cited by examiner

*Primary Examiner* — Bradley Smith
(74) *Attorney, Agent, or Firm* — IP & T Group LLP

(57) ABSTRACT

In a method for manufacturing a transistor, a gate structure may be formed on a semiconductor substrate. A first material layer may be formed on the gate structure to expose an upper sidewall of the gate structure. A spacer including a second material layer may be formed on the upper sidewall of the gate structure. The first material layer may be isotropically etched using the spacer as an etch mask to form a space. An insulating interlayer may be formed on the semiconductor substrate. The insulating interlayer may not be formed in the space.

15 Claims, 10 Drawing Sheets

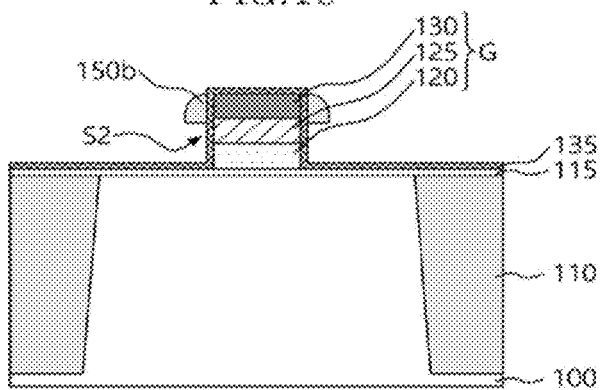
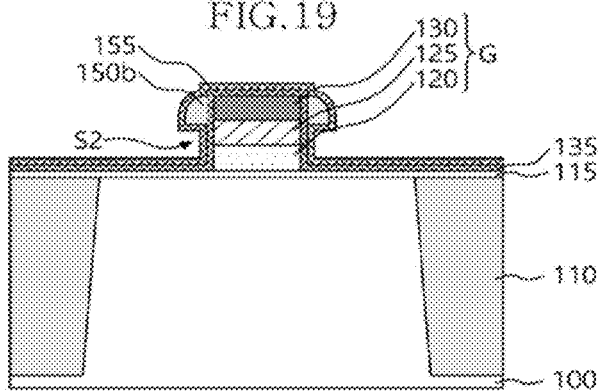
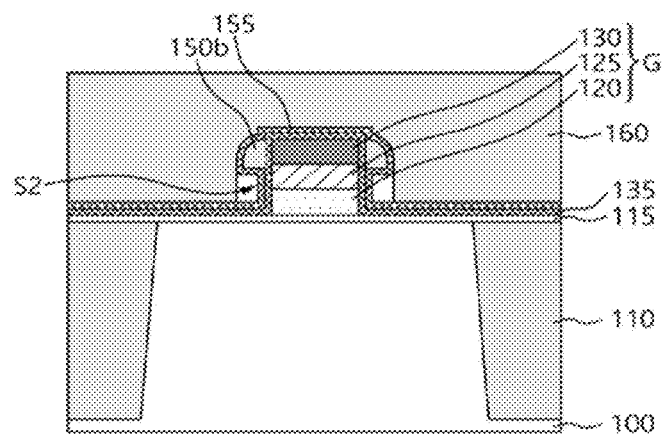

METHOD FOR MANUFACTURING A TRANSISTOR AND METHOD FOR MANUFACTURING A RING OSCILLATOR USING THE SAME

CROSS-REFERENCES TO RELATED APPLICATION

The present application claims priority under 35 U.S.C. § 119(a) to Korean application number 10-2017-0022388, filed on Feb. 20, 2017, which is herein incorporated by reference in its entirety.

BACKGROUND

1. Technical Field

Various embodiments generally relate to a method for manufacturing a semiconductor integrated circuit device, more particularly, to a method for manufacturing a transistor, and a method for manufacturing a ring oscillator using the same.

2. Related Art

Generally, a semiconductor device may include adjacent conductive structures and a dielectric layer interposed between the conductive structures. Since the semiconductor device may be highly integrated, a gap between the conductive structures may become narrower which increases parasitic capacitance. The high parasitic capacitance may result in decreased performance of the semiconductor device.

In order to reduce the parasitic capacitance, a dielectric constant of a dielectric layer may be lowered. However, since the dielectric constant of the dielectric layer may be very high, merely lowering the dielectric constant of the dielectric layer cannot reduce the parasitic capacitance to a satisfactory level.

SUMMARY

According to an embodiment, there may be provided a method for manufacturing a transistor. In the method for manufacturing the transistor, a gate structure may be formed on a semiconductor substrate. A first material layer may be formed on the gate structure to expose an upper sidewall of the gate structure. A spacer including a second material layer may be formed on the upper sidewall of the gate structure. The first material layer may be isotropically etched using the spacer as an etch mask to form a space.

An insulating interlayer may be formed on the semiconductor substrate. The insulating interlayer may not be formed in the space.

According to an embodiment, there may be provided a method for manufacturing a transistor. In the method for manufacturing the transistor, a gate structure may be formed on a semiconductor substrate. A first spacer may be formed on a lower sidewall of the gate structure. A second spacer may be formed on the first spacer. An etchant may be supplied to the first spacer through a side surface of the first spacer to selectively remove the first spacer, thereby forming a space under the second spacer. An insulating interlayer may be formed on the semiconductor substrate. The insulating interlayer may not be formed in the space to form an air spacer in the space.

According to an embodiment, there may be provided a method for manufacturing a ring oscillator. The ring oscillator may include inverters serially connected with each other. Each of the inverters may include an NMOS transistor and a PMOS transistor. In the method for manufacturing the ring oscillator, a gate structure may be formed on a semiconductor substrate. A first spacer may be formed on a lower sidewall of the gate structure. A second spacer may be formed on the first spacer. An etchant may be supplied to the first spacer through a side surface of the first spacer to selectively remove the first spacer, thereby forming a space under the second spacer. An insulating interlayer may be formed on the semiconductor substrate. The insulating interlayer may not be formed in the space to form an air spacer in the space.

BRIEF DESCRIPTION OF THE DRAWINGS

FIGS. 15 to 20 are cross-sectional views illustrating a method for manufacturing a transistor in accordance with example embodiments.

DETAILED DESCRIPTION

Figure 1:
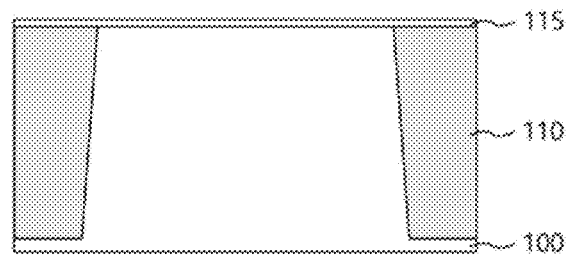
FIGS. 1 to 14 are cross-sectional views illustrating a method for manufacturing a transistor in accordance with example embodiments.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer and intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Hereinafter, examples of the embodiments will be described with reference to the accompanying drawings.

FIGS. 1 to 14 are cross-sectional views illustrating a method for manufacturing a transistor in accordance with example embodiments.

Referring to FIG. 1, an isolation layer 110 may be formed in a semiconductor substrate 100. The isolation layer 110 may be formed by a shallow trench isolation (STI) process. A gate insulating layer 115 may be formed on the isolation layer 110 and the semiconductor substrate 100.

Figure 2:
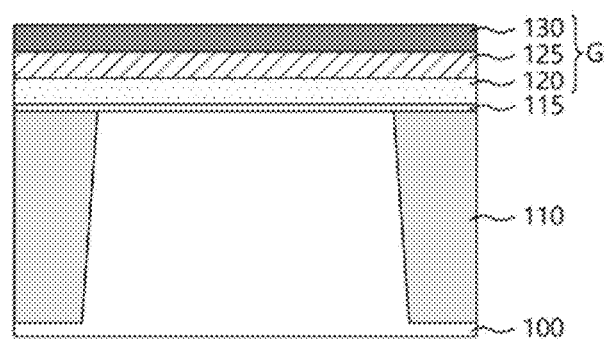

Referring to FIG. 2, a polysilicon layer 120 and a metal layer 125 may be sequentially formed on the gate insulating layer 115. The polysilicon layer 120 and the metal layer 125 may act as a gate conductive layer. The metal layer 125 may include a transition metal layer such as a tungsten layer, a titanium layer, a tantalum layer, etc. A hard mask layer 130 may be formed on the metal layer 125. The hard mask layer 130 may include a silicon nitride layer.

Figure 3:
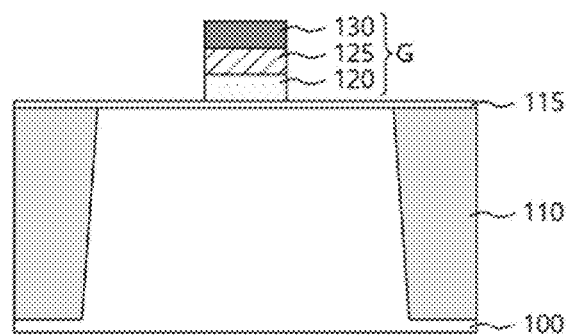

Referring to FIG. 3, the hard mask layer 130, the metal layer 125 and the polysilicon layer 120 may be patterned to form a gate structure G.

Figure 4:
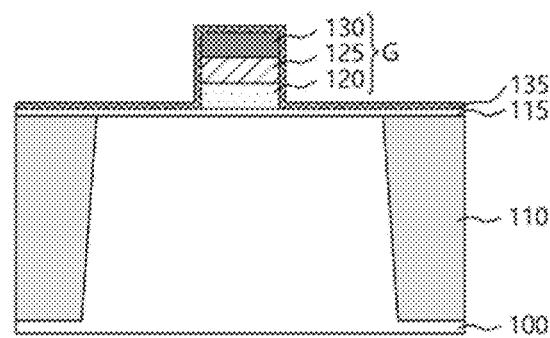

Referring to FIG. 4, a first liner 135 may be formed on the gate structure G and the gate insulating layer 115. The first liner 135 may include a material substantially the same as that of the hard mask layer 130. Thus, the first liner 135 may include a silicon nitride layer. The first liner 135 may have a thickness of several to dozens of angstroms.

Figure 5:
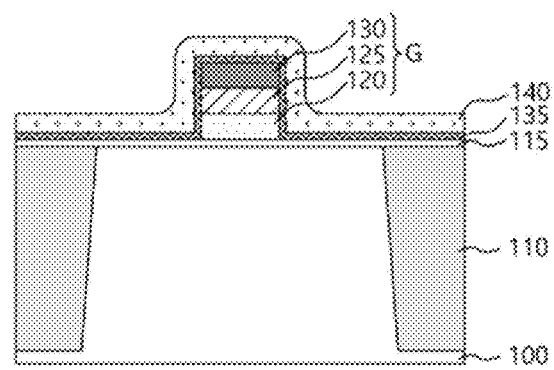

Referring to FIG. 5, a first material layer 140 may be formed on the first liner 135. The first material layer 140 may include a material having an etching selectivity with respect to the first liner 135, the hard mask layer 130 and the gate insulating layer 115. For example, the first material layer 140 may include a silicon germanium layer.

Figure 6:
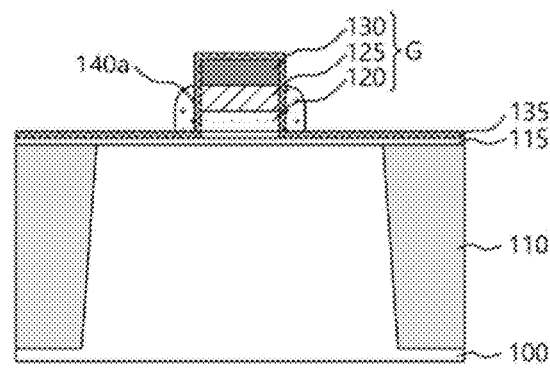

Referring to FIG. 6, the first material layer 140 may be anisotropically etched to form a first spacer 140a. In example embodiments, the first material layer 140 may be over-etched such that the first spacer 140 has a lower height than that of the gate structure G.

Figure 7:
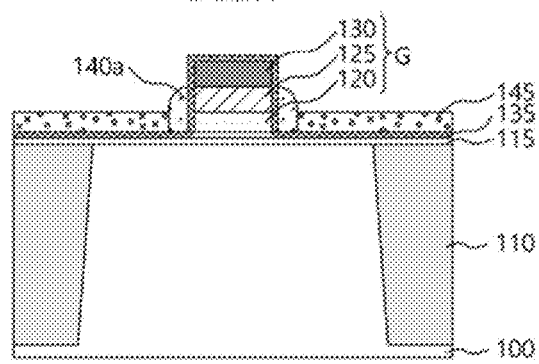

Referring to FIG. 7, a planarizing layer 145 may be formed over the semiconductor substrate 100. The planarizing layer 145 may include a liquefied insulating layer having good planarization characteristics. For example, the planarizing layer 145 may include spin on glass (SOG) or spin on carbon (SOC). The planarizing layer 145 may have a thickness thinner than the height of the first spacer 140a. The planarizing layer 145 on the semiconductor substrate 100 may be recessed until an upper surface of the first spacer 140a is exposed.

Figure 8:
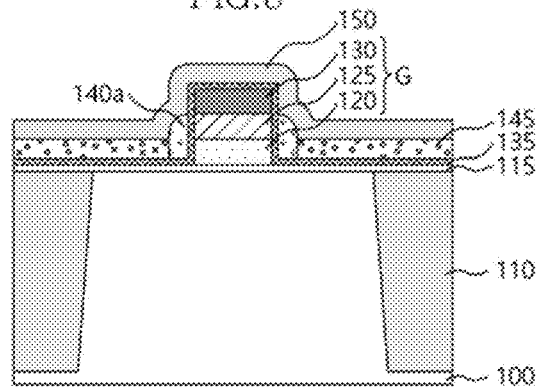

Referring to FIG. 8, a second material layer 150 may be formed on the planarizing layer 145, the first spacer 140a and the first liner 135. The second material layer 150 may include a material having an etching selectivity with respect to the first material layer 140, the planarizing layer 145 and the first liner 135. For example, the second material layer 150 may include a silicon oxide layer.

Figure 9:
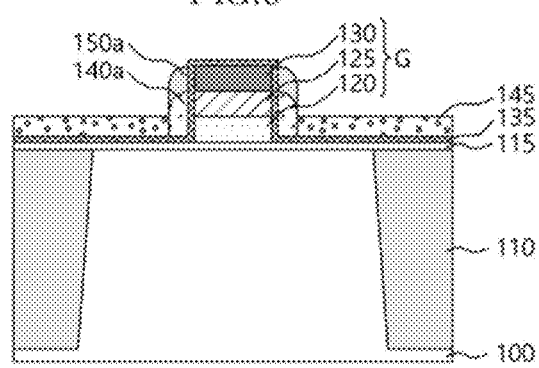

Referring to FIG. 9, the second material layer 150 may be anisotropically etched until the hard mask layer 130 and the planarizing layer 145 may be exposed to form a second spacer 150a on the first spacer 140a.

Figure 10:
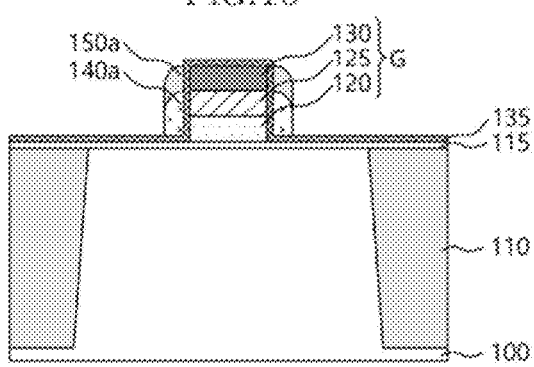
Figure 11:
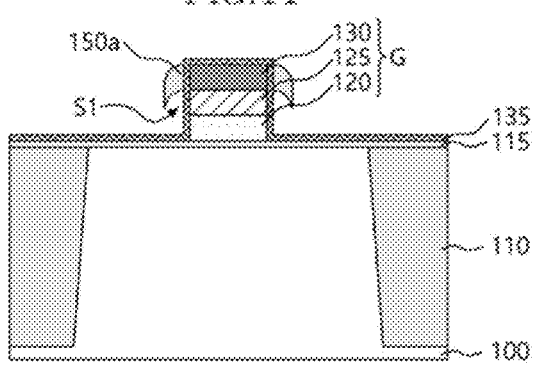

Referring to FIG. 10, the planarizing layer 145 may be selectively removed. The planarizing layer 145 which includes the liquefied insulating layer may have an etching selectivity with respect to the hard mask layer 130 including silicon nitride, the first spacer 140a including silicon germanium, the second spacer 150a including silicon oxide and the first liner 135 including silicon nitride. Particularly, an etching rate of the planarizing layer 145 may be faster than that of silicon oxide such as the second spacer 140a. Thus, when the planarizing layer 145 is etched, the hard mask layer 130, the first spacer 140a and the second spacer 150a may not be etched so that only the planarizing layer 145 may be removed.

By removing the planarizing layer 145, a sidewall of the first spacer 140a may be exposed. The exposed sidewall of the first spacer 140a may be selectively removed by a wet chemical. Since the first spacer 140a including silicon germanium may have an etching selectivity with respect to the first liner 115 and the second spacer 150a, only the first spacer 140a may be removed to form a spacer S1 in FIG. 11. In example embodiments, an etchant may be supplied through the sidewall of the first spacer 140a. The sidewall may occupy a greater part of surfaces of the first spacer 140a so that the sidewall of the first spacer 140a may readily make a contact with the etchant. Therefore, the sidewall of the first spacer 140a may be readily removed when compared to an upper surface of the first spacer 140a.

Figure 12:
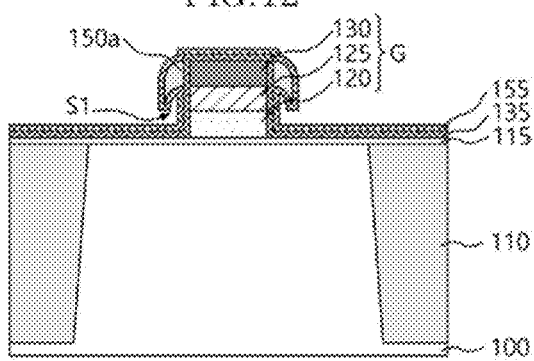

Referring to FIG. 12, a second liner 155 may be formed on a resultant structure of the semiconductor substrate 100. The second liner 155 may include a silicon nitride layer. The second liner 155 may be formed on the upper surface of the semiconductor substrate 100, a surface of the second spacer 150a, a surface of the hard mask layer 130 and an inner surface of the space S1. The first and second liners 135 and 155 may be formed by a chemical vapor deposition (CVD) process, an atomic layer deposition (ALD) process, etc.

Figure 13:
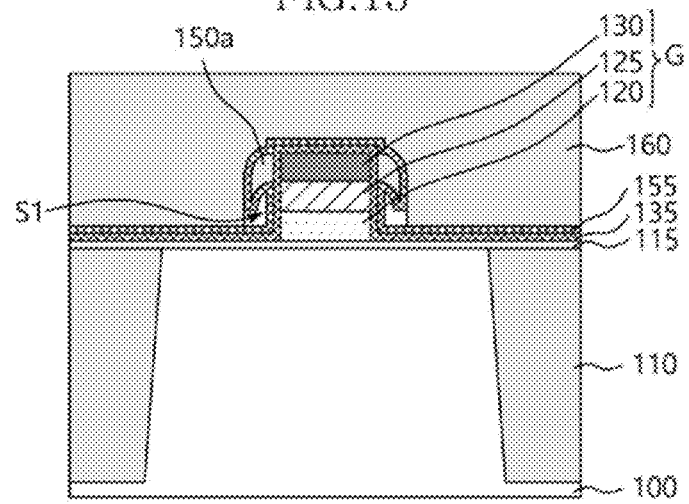

Referring to FIG. 13, an insulating interlayer 160 may be formed by an anisotropic deposition process. In the anisotropic deposition process, a deposition speed in a first direction may be faster than a deposition speed in a second direction opposite to the first direction. For example, a deposition speed in a direction substantially perpendicular to the upper surface of the semiconductor substrate 100 may be different from a deposition speed in a direction substantially parallel to the upper surface of the semiconductor substrate 100. When the deposition speed in the direction substantially perpendicular to the upper surface of the semiconductor substrate 100 is faster than the deposition speed in the direction substantially parallel to the upper surface of the semiconductor substrate 100, the insulating interlayer 160 may be formed on the semiconductor substrate 100. In contrast, the insulating interlayer 160 may not be formed in the space S1. The anisotropic deposition process may be performed under a high pressure using a dosage of a source gas greater than a set dosage to form the insulating interlayer 160.

By forming the insulating interlayer 160 by the anisotropic deposition process, the space S1 may not be filled with the insulating interlayer 160 so that the space S1 is filled with air therein. Thus, the space S1 may function as an air spacer. The air may have a dielectric constant of about 1 lower than a dielectric constant of about 3.9 of silicon oxide and a dielectric constant of about 7 of silicon nitride. Thus, the air spacer may decrease a dielectric constant of a dielectric layer, which causes reduction of a parasitic capacitance of a semiconductor integrated circuit device.

Further, the air spacer may have a variable size by controlling a thickness of the first material layer 140 so that greater parasitic capacitance may be reduced.

The first spacer 140a used as a sacrificial layer may be exposed through the sidewall of the first spacer 140a so that an exposed area of the first spacer 140a may be increased. Therefore, the first spacer 140a may be completely removed. Further, a removed amount of the first spacer 140a may be adjusted by controlling an amount of an etching chemical thereby controlling the size of the air spacer.

Figure 14:
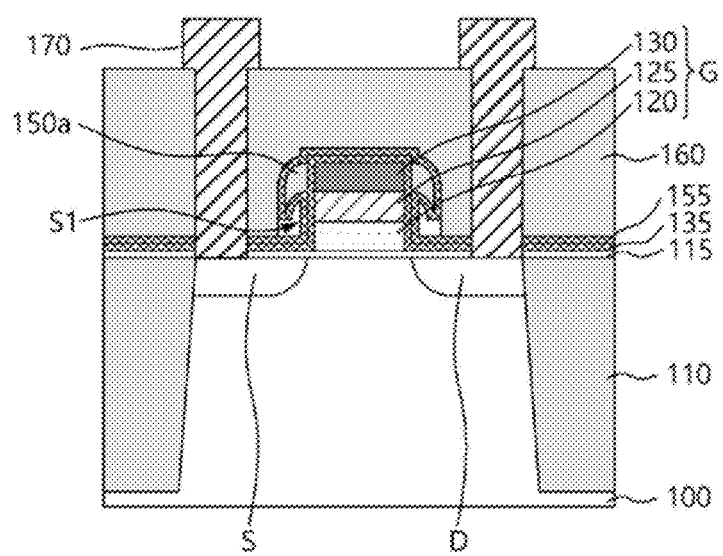

Referring to FIG. 14, impurities may be implanted into the semiconductor substrate 100 at both sides of the gate structure G to form a source S and a drain D. A conductive wiring 170 may then be formed. The conductive wiring 170 may contact the source S and the drain D. The conductive wiring 170 may be formed through the insulating interlayer 160.

A parasitic capacitor may be generated between a portion of the conductive wiring 170 in the insulating interlayer 160 and the conductive layers 120 and 125 in the gate structure G. However, the air spacer S1 between the conductive wiring 170 and the conductive layers 120 and 125 may greatly decrease parasitic capacitance when compared to an insulating spacer between the conductive wiring 170 and the conductive layers 120 and 125.

FIGS. 15 to 20 are cross-sectional views illustrating a method for manufacturing a transistor in accordance with example embodiments.

A method for manufacturing a transistor in accordance with example embodiment may include processes substantially the same as those illustrated with reference to FIGS. 1 to 4. Thus, the same reference numerals may refer to the same elements and any further illustrations with respect to the same processes may be omitted herein for brevity.

Figure 15:
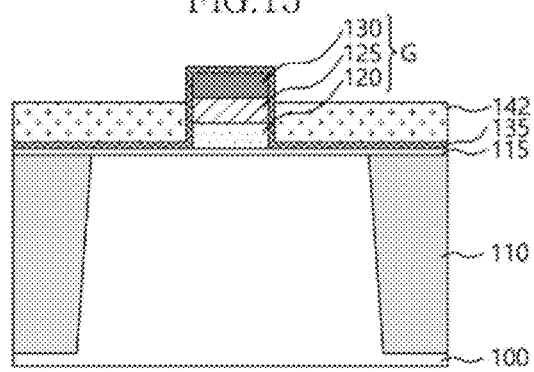

Referring to FIG. 15, a first material layer 142 may be formed on the first liner 135 configured to cover the gate structure G. The first material layer 142 may include a material having an etching selectivity with respect to the first liner 135, the hard mask layer 130 and the gate insulating layer 115. For example, the first material layer 142 may include silicon germanium. The first material layer 142 may have a height greater than that of the gate structure G. Thus, the hard mask layer 130 covered by the first liner 135 may be exposed through the first material layer 142.

Figure 16:
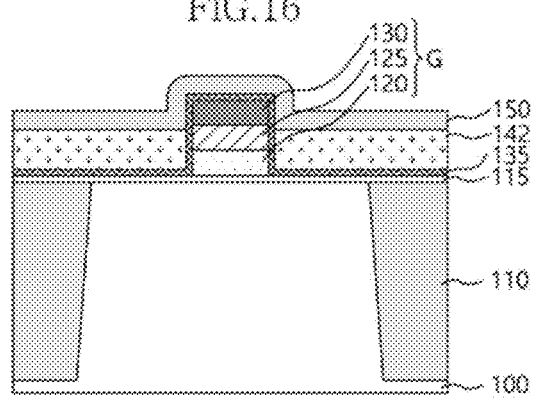

Referring to FIG. 16, a second material layer 150 may be formed on the first material layer 142 and the first liner 135. The second material layer 150 may include a material having an etching selectivity with respect to the first material layer 142, the planarizing layer 145 and the first liner 135. For example, the second material layer 150 may include silicon oxide.

Figure 17:
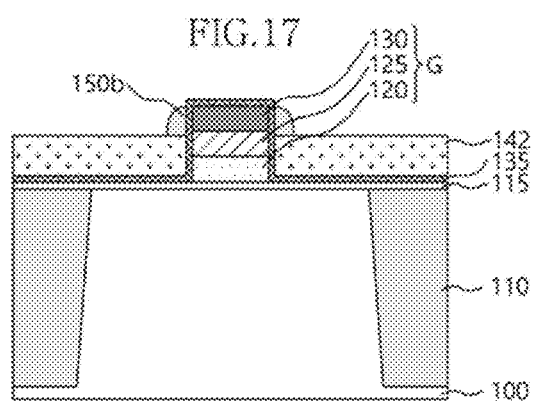

Referring to FIG. 17, the second material layer 150 may be anisotropically etched until a surface of the hard mask layer 130 and/or the first material layer 142 forms a spacer 150b.

Referring to FIG. 18, the first material layer 142 may be wet-etched using the spacer 150b, the first liner 135 and the hard mask layer 130 as an etch mask. Since the wet etching process may have an isotropic etching characteristic, a portion of the first material layer 142 under the spacer 150b as well as a portion of the first material layer 142 outside the spacer 150b may be completely removed. By removing the first material layer 142, a space S2 may be formed.

Referring to FIG. 19, a second liner 155 may be formed on the upper surface of the semiconductor substrate 100, an inner surface of the space S2, a surface of the spacer 150b and a surface of the hard mask layer 130. The second liner 155 may include silicon nitride.

Referring to FIG. 20, an insulating interlayer 160 may be formed by an anisotropic deposition process. The insulating interlayer 160 may have a thickness for fully covering the gate structure G. When the deposition speed in the direction substantially perpendicular to the upper surface of the semiconductor substrate 100 is faster than the deposition speed in the direction substantially parallel to the upper surface of the semiconductor substrate 100, the insulating interlayer 160 may be formed on the semiconductor substrate 100. In contrast, the insulating interlayer 160 may not be formed in the space S2. By forming the insulating interlayer 160 by the anisotropic deposition process, the space S2 may not be filled with the insulating interlayer 160 so that the space S1 is filled with air therein. Thus, the space S2 may function as an air spacer.

The anisotropic deposition process may be performed under a high pressure using a dosage of a source gas greater than a set dosage to form the insulating interlayer 160.

A size of the space S2, that is, an amount of air may be readily determined in accordance with the thickness of the first material layer 142 and a width of the spacer 150b.

Figure 21:
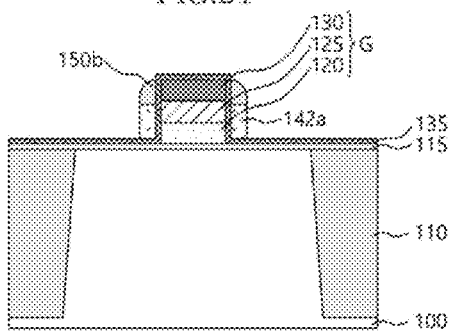
FIG. 21 is a cross-sectional view illustrating a transistor in accordance with example embodiments.

In example embodiments, only the second material layer 150 may be anisotropically etched. Alternatively, as shown in FIG. 21, the first material layer 142 as well as the second material layer 150 may be anisotropically etched. The following processes substantially the same as those illustrated above may be performed.

Figure 22:
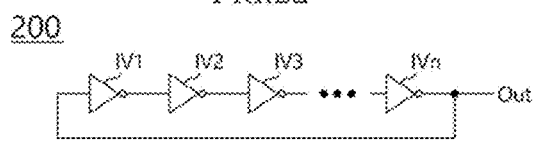
FIG. 22 is a circuit diagram illustrating a ring oscillator in accordance with example embodiments.
Figure 23:
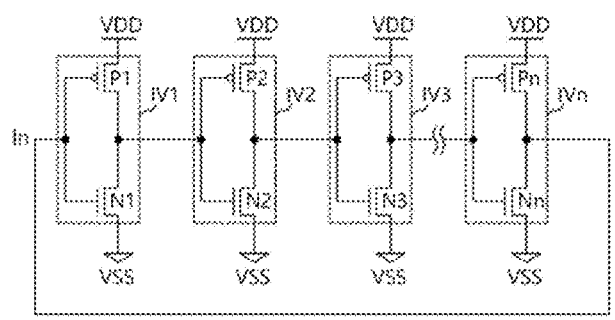
FIG. 23 is a detail circuit diagram illustrating the ring oscillator shown in FIG. 22.

FIG. 22 is a circuit diagram illustrating a ring oscillator in accordance with example embodiments, and FIG. 23 is a detail circuit diagram illustrating the ring oscillator shown in FIG. 22.

Referring to FIG. 22, a ring oscillator may include a plurality of inverters IV1 to IVn serially connected with each other. The final inverter IVn among the inverters IV1 to IVn may output an output signal. The output signal may be provided to the first inverter IV1 as an input signal.

Referring to FIG. 23, each of the inverters IV1 to IVn may include PMOS transistors P1 to Pn and NMOS transistors N1 to Nn connected between a power voltage Vdd and a ground voltage Vss. The PMOS transistor and the NMOS transistor in the respective inverters IV1 to IVn may receive an output signal of an inverter of the previous stage as a gate voltage. The PMOS transistor P1 and the NMOS transistor N1 in the first inverter IV1 may receive the output signal of the final inverter IVn as a gate voltage.

Figure 24:
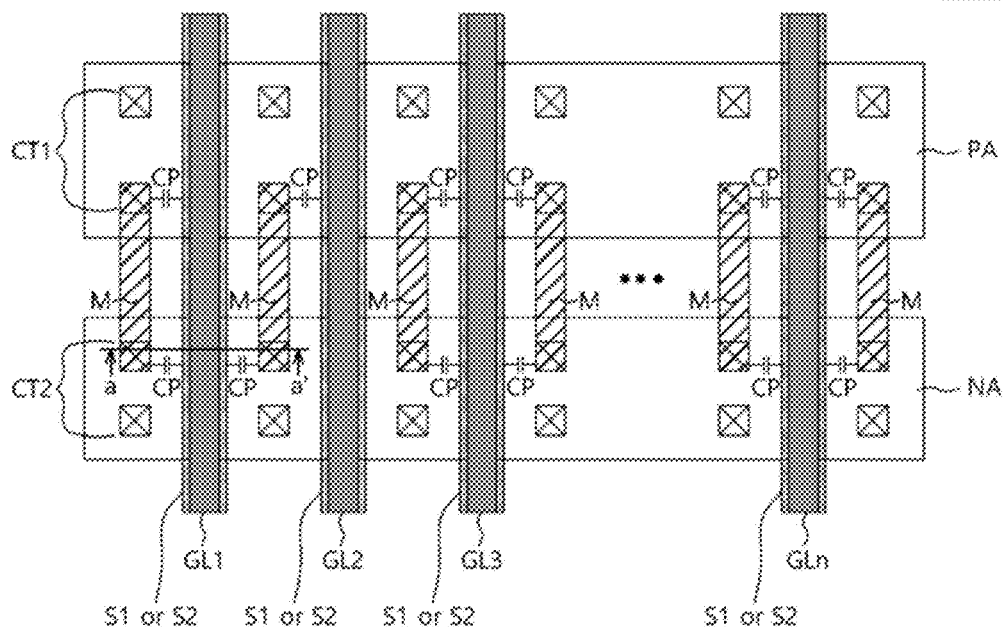
FIG. 24 is a layout illustrating a semiconductor substrate including the ring oscillator shown in FIG. 23.

FIG. 24 is a layout illustrating a semiconductor substrate including the ring oscillator of FIG. 23.

Referring to FIG. 24, the inverters IV1 to IVn may be arranged on a semiconductor substrate 210. A first active region PA in which the PMOS transistors may be formed and a second active region NA in which the NMOS transistors may be formed may be defined on the semiconductor substrate 210. For example, the first active region PA may include an N-well region and the second active region NA may include a P-well region.

A plurality of gate electrode lines GL1 to GLn may cross the first and second active regions PA and NA. The gate electrode lines GL1 to GLn may be parallel to each other. Gaps between the gate electrode lines GL1 to GLn may be uniform. P-type impurities may be implanted into the first active region PA at both sides of the gate electrode lines GL1 to GLn to form junction regions of the PMOS transistor such as a source and a drain. N-type impurities may be implanted into the second active region NA at both sides of the gate electrode lines GL1 to GLn to form junction regions of the NMOS transistor.

Contacts CT may be formed on the junction regions. The contacts CT may be electrically connected with conductive wirings to be formed on the junction regions. A contact CT1 of the first active region PA and a contact CT2 of the second active region NA adjacent to the contact CT1 may be connected with each other via an output wiring M. Although not depicted in drawings, the output wiring M may be electrically connected with a next gate electrode line through an upper wiring. The contacts CT1 and CT2 and the output wiring M may correspond to the conductive wiring 170.

Fabrication characteristics of the semiconductor device may be identified based on a delay value of the ring oscillator. The ring oscillator delay (ROD) may be determined in accordance with a parasitic capacitance and a mismatch ratio between the PMOS transistor and the NMOS transistor.

The parasitic capacitance may be generated between the contacts CT1 and CT2 and the gate electrode lines GL1 to GLn. Further, the parasitic capacitance may also be generated between the output wiring M and the gate electrode lines GL1 to GLn.

Figure 25:
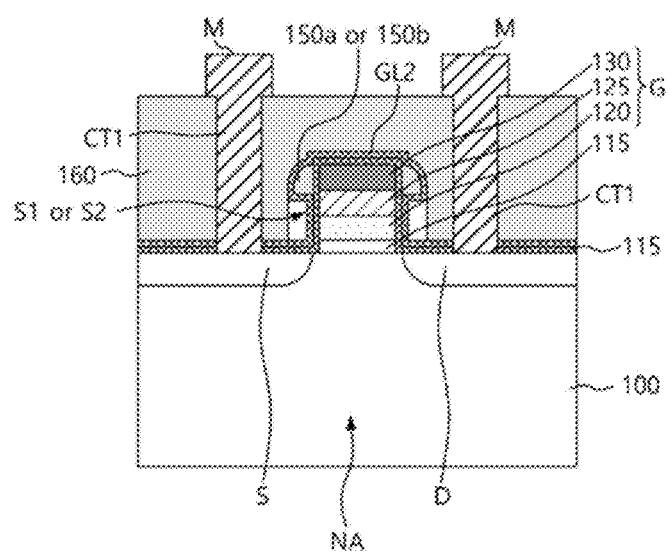
FIG. 25 is a cross-sectional view taken along a line a-a' in FIG. 24.

As shown in FIG. 25, since the air spacers may be formed at the sidewall of the gate electrode lines GL1 to GLn, the parasitic capacitance may be reduced to decrease the ring oscillator delay.

Figure 26:
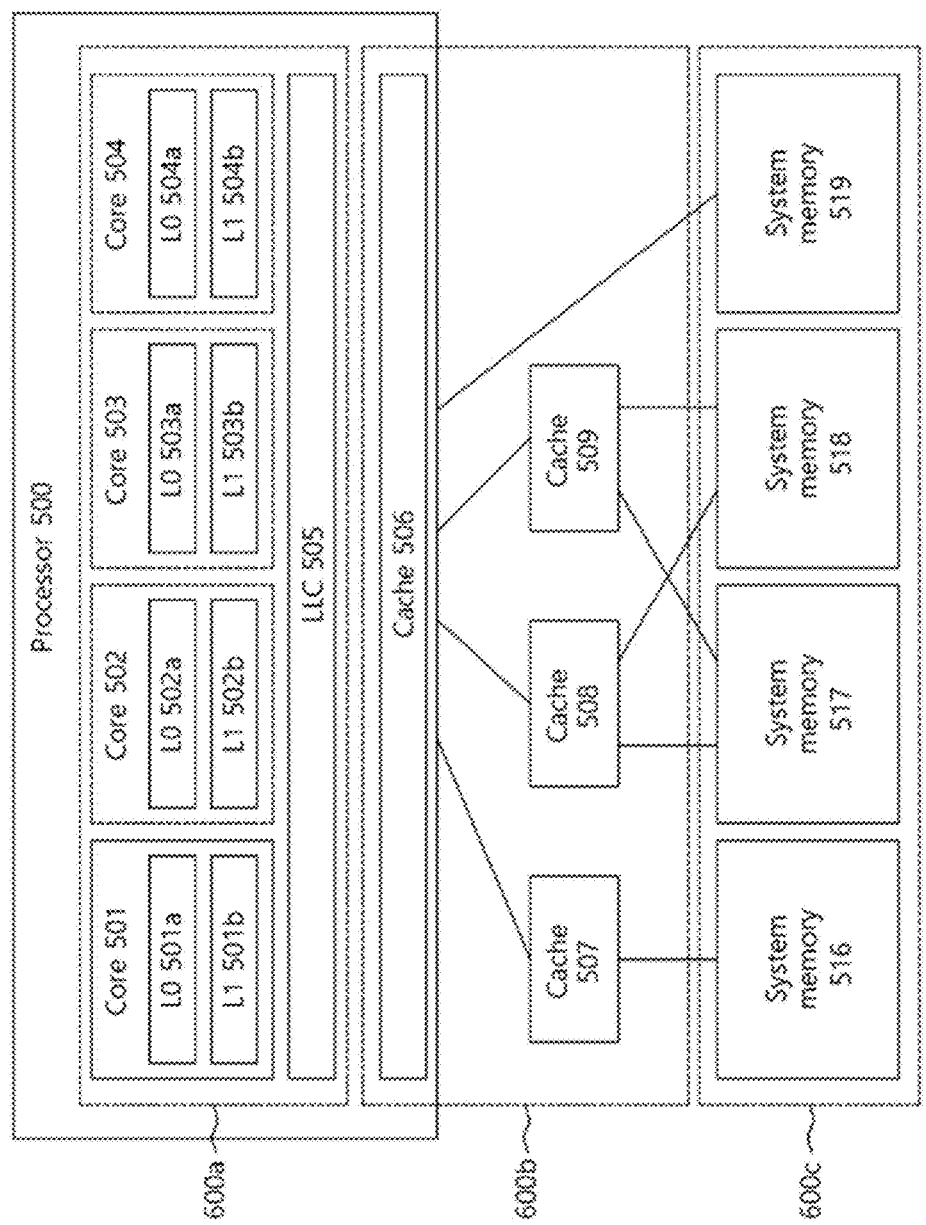
FIG. 26 is a block diagram illustrating a computer system in accordance with example embodiments.

FIG. 26 is a block diagram illustrating a computer system in accordance with example embodiments.

Referring to FIG. 26, a computer system of this example embodiment may include a processor 500, a cache memory 507 to 509 and a plurality of system memories 516 to 519.

The processor 500 may include a plurality of cores 501 to 504. Each of the cores 501 to 504 may include an upper level of caches L0 and a middle level of caches L1. The upper level of the caches L0 and the middle level of the caches L1 may be dedicated to the corresponding cores 501 to 504.

The processor 500 may include a lower level of caches LLC commonly shared with the cores 501 to 504. The processor 500 may further include a common cache 506 provided as a near memory.

A cache group may include a plurality of sub-caches 507 to 509. The cache group may be arranged between the processor 500 and the system memories 516 to 519. The sub-caches 507 to 509 may be operated to correspond to the system memories 516 to 519 divided by addresses. For example, the first sub-cache 507 may be used as a memory controller of the first system memory 516 corresponding to a first address section. The second sub-cache 508 may be used as a memory controller for controlling a non-overlapped portion between the second system memory 517 and the third system memory 518 corresponding to a second address section.

The system memories 516 to 519 may include a memory in which software running on the processor 500, may directly access. In contrast, the caches 501a to 509 may be commanded by the cores 501 to 504 while the software is running. The system memories 516 to 519 may be manually operated as a part of the processor and/or automatically operated by the software.

The system memories 516 to 519 may include a far memory and a near memory. The far memory and the near memory may be implemented with the semiconductor integrated circuit device including the transistor with the air spacer.

The computer system may be interfaced with a dual in-line memory module (DIMM) as a storage device including the semiconductor integrated circuit device. The semiconductor integrated circuit device in the DIMM may include the transistor having the air spacer described above.

The DIMM and the computer system may use a DRAM channel such as a DDR3, DDR4, DDR5, etc., as an interface. Reference numerals 600a, 600b and 600c may indicate a cache for an internal processor, a near memory operated as a remote memory cache, and a system memory, respectively.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A method for manufacturing a transistor, the method comprising:
    forming a gate structure on a semiconductor substrate;
    forming a first material layer including a first material to expose an upper sidewall of the gate structure, thereby forming a first spacer;
    forming a planarizing layer beside the first spacer;
    forming a second spacer including a second material on the first spacer;
    selectively removing the planarizing layer to expose a sidewall of the first spacer;
    isotropically etching the first spacer to form a space; and
    forming an insulating interlayer over the semiconductor substrate including the gate structure,
    wherein the insulating interlayer is not formed in the space so that an air spacer is formed in the space.

2. The method of claim 1, wherein the forming of the first material layer comprises:
    forming the first material layer on the semiconductor substrate and the gate structure; and
    anisotropically etching the first material layer to form the first spacer including the first material having a height lower than a height of the gate structure.

3. The method of claim 1, wherein the planarizing layer comprises a liquefied insulating layer including a spin on glass (SOG) or a spin on carbon (SOC).

4. The method of claim 1, wherein the forming of the gate structure comprises:
    forming a gate insulating layer on the semiconductor substrate;
    forming a gate conductive layer on the gate insulating layer;
    forming a hard mask layer on the gate conductive layer; and
    patterning the hard mask layer and the gate conductive layer.

5. The method of claim 1, further comprising forming a first liner on the semiconductor substrate and the gate structure between the forming of the gate structure and the forming of the first material layer.

6. The method of claim 5, wherein the first liner comprises silicon nitride.

7. The method of claim 5, wherein the first material has an etching selectivity with respect to a material of the first liner and the second material.

8. The method of claim 7, wherein the first material comprises silicon germanium.

9. The method of claim 8, wherein the second material has an etching selectivity with respect to the material of the first liner and the first material.

10. The method of claim 9, wherein the second material comprises silicon oxide.

11. The method of claim 5, further comprising forming a second liner on the semiconductor substrate, an inner surface of the space, a surface of the second spacer including the second material and a surface of the first liner between the forming of the space and the forming of the insulating interlayer.

12. The method of claim 1, wherein the forming of the insulating interlayer comprises anisotropically depositing the insulating interlayer under a condition that a deposition speed in a direction substantially perpendicular to a surface of the semiconductor substrate is faster than a deposition speed in a direction substantially parallel to the surface of the semiconductor substrate.

13. A method for manufacturing a transistor, the method comprising:
- forming a gate structure on a semiconductor substrate;
- forming the first material layer on the semiconductor substrate to fill up a space between the gate structures;
- recessing the first material layer to expose the upper sidewall of the gate structure;
- forming a spacer including a second material on the exposed upper sidewall of the gate structure;
- anisotropically etching the first material layer to form a space; and
- forming an insulating interlayer over the semiconductor substrate including the gate structure,
- wherein the insulating interlayer is not formed in the space so that an air spacer is formed in the space.

14. A method for manufacturing a ring oscillator including serially connected inverters, each inverter including an NMOS transistor and a PMOS transistor, the method comprising:
- forming a gate structure on a semiconductor substrate;
- forming a first spacer on a lower sidewall of the gate structure;
- forming a planarizing layer beside the first spacer;
- forming a second spacer over the first spacer;
- selectively removing the planarizing layer to expose a sidewall of the first spacer;
- removing the first spacer by supplying an etchant to form a space under the second spacer; and
- forming an insulating interlayer over the semiconductor substrate including the gate structure,
- wherein the insulating interlayer is not formed in the space so that an air spacer is formed in the space.

15. The method of claim 14, wherein the first and second spacers have an etching selectivity with respect to a specific etchant.

* * * * *